(12) United States Patent
Ichijo et al.

(10) Patent No.: US 7,342,283 B2
(45) Date of Patent: Mar. 11, 2008

(54) SEMICONDUCTOR DEVICE

(75) Inventors: Hisao Ichijo, Kyoto (JP); Hiroyoshi Ogura, Kyoto (JP); Yoshinobu Sato, Osaka (JP); Teruhisa Ikuta, Nara (JP); Toru Terashita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 140 days.

(21) Appl. No.: 11/370,038

(22) Filed: Mar. 8, 2006

(65) Prior Publication Data

US 2006/0255406 A1 Nov. 16, 2006

(30) Foreign Application Priority Data

May 16, 2005 (JP) ............................. 2005-142232

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................. 257/365; 257/369; 257/E29.264

(58) Field of Classification Search ................ 257/365, 257/369, 347, E29.264
See application file for complete search history.

(56) References Cited

U.S. PATENT DOCUMENTS

2006/0027874 A1* 2/2006 Tsai et al. ................... 257/365

FOREIGN PATENT DOCUMENTS

JP 11-330383 11/1999

OTHER PUBLICATIONS

English language abstract of JP 11-330383.

* cited by examiner

*Primary Examiner*—Phat X Cao
(74) *Attorney, Agent, or Firm*—Greenblum & Bernstein, P.L.C.

(57) ABSTRACT

An object of the present invention is to provide a semiconductor device which enables to reduce the device area, while securing the breakdown voltage between the drain and the source of each MOS transistor for the semiconductor device including plural MOS transistors, which are arrayed adjacently each other, with different types of channel conductivity. The semiconductor device includes a semiconductor substrate, a buried oxide film and a semiconductor layer, and furthermore the semiconductor layer has an island-like semiconductor layer, in which a MOS transistor is formed, the MOS transistor has a source region, and a drain region that is positioned in the periphery of the source region, an island-like semiconductor layer, in which a MOS transistor is formed, the MOS transistor has a drain region, and a source region that is positioned in the periphery of the drain region, an isolation trench which isolates the former island-like semiconductor layer from other portions of the semiconductor layer, an isolation trench which isolates the latter island-like semiconductor layer from other portions of the semiconductor layer, and a buffer region, in which the electric potential is fixed to the lowest electric potential in a circuit, which prevents an electrical interference occurred between transistors.

5 Claims, 8 Drawing Sheets

Prior Art

SEMICONDUCTOR DEVICE

BACKGROUND OF THE INVENTION (1) Field of the Invention

The present invention relates to a semiconductor device, and in particular to a Metal Oxide Semiconductor (MOS) transistor formed in a Silicon-on-Insulator (SOI) substrate.

(2) Description of the Related Art

In recent years, a semiconductor device, in which an N-channel MOS transistor and a P-channel MOS transistor are formed in an SOI substrate, is utilized for various applications. Particularly, a semiconductor device, which adopts a MOS transistor having an offset structure, is used for a drive circuit with a high breakdown voltage.

In fact, in a semiconductor device including plural MOS transistors on a semiconductor substrate, a buffer region is formed between transistors, so that each transistor is not affected by an electrical interference from an adjacent transistor. In addition, an electric potential applied to the buffer region is actually specified to the same electric potential applied to a source of the adjacent MOS transistor, so as to improve the breakdown voltage between a drain and the source in the MOS transistor. The MOS transistor using such method is disclosed for example in Japanese Laid-Open Patent Application No. H11-330383.

Figure 1:
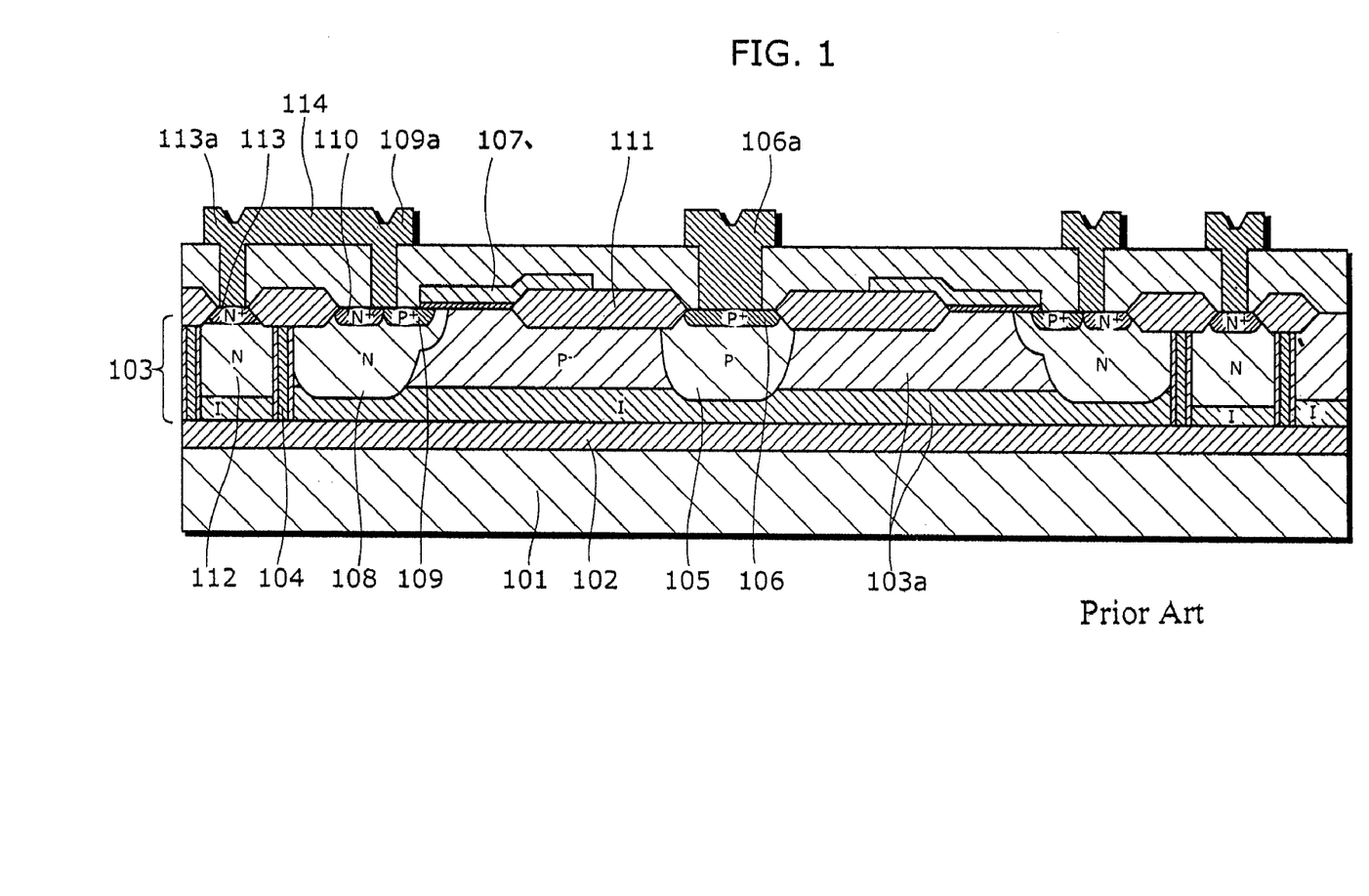
FIG. 1 is a cross-sectional diagram of a conventional P-channel MOS transistor disclosed in Japanese Laid-Open Patent Application No. H11-330383.

Hereafter the exemplified conventional MOS transistor disclosed in Japanese Laid-Open Patent Application No. H11-330383 is described referring to FIG. 1. FIG. 1 is a cross-sectional diagram of a P-channel MOS transistor formed in an SOI substrate.

As shown in FIG. 1, the aforesaid conventional P-channel MOS transistor includes an SOI substrate which has a semiconductor substrate 101, a buried oxide film 102 formed on the semiconductor substrate 101, and a semiconductor layer 103 formed on the buried oxide film 102. The semiconductor layer 103 has an island-like semiconductor layer 103a, of which a P-channel MOS transistor structure is formed, isolated from other elements forming regions by an isolation trench 104. In addition, an I layer with an extremely low concentration impurity, which functions as an intrinsic semiconductor layer substantially, is formed in the region adjacent to the buried oxide film 102 in the semiconductor layer 103. The I layer functions as an electric field alleviation layer.

A drain region 105, which is a P-type impurity layer with a low concentration impurity, is formed in the island-like semiconductor layer 103a. A drain contact region 106, which is a P-type impurity layer with a high concentration impurity, is formed on the surface of the drain region 105, and a drain electrode 106a is placed on the drain contact region 106. In addition, a ring-shaped gate electrode 107 which is made of polycrystalline silicon, and a ring-shaped body region 108, which is an N-type impurity layer with a low concentration impurity, are formed centering on the drain region 105 in the periphery of the drain region 105. A ring-shaped source region 109, which is a P-type impurity layer with a high concentration impurity, and a ring-shaped body contact region 110, which is an N-type impurity layer with a high concentration impurity, are formed in the body region 108.

A source electrode 109a is placed on the source region 109 and the body contact region 110, and the source region 109 and the body region 108 are electrically connected by the source electrode 109a. In addition, a LOCOS oxide film 111 for alleviating electric field concentration is formed in a predetermined part in the island-like semiconductor layer 103a.

A buffer region 112, which is an N-type impurity layer with a low concentration impurity, is formed in the outer periphery region of the island-like semiconductor layer 103a in other words in the outer periphery region adjacent to the island-like semiconductor layer 103a across the isolation trench 104, so as not to be affected by an electrical interference from the other adjacent elements. A buffer contact layer 113, which is an N-type impurity layer with a high concentration impurity, is formed on the surface of the buffer region 112, and a buffer electrode 113a is placed on the buffer contact layer 113.

Accordingly, the conventional P-channel MOS transistor having the aforesaid structure is characterized in that the drain region 105 is formed in the center of the island-like semiconductor layer 103a, the source region 109 and the body region 108 are formed in the outer periphery of the drain region 105, and a connection unit 114 is placed so as to make the electric potential in the buffer electrode 113a the same as the electric potential in the source electrode 109a.

Figure 2:
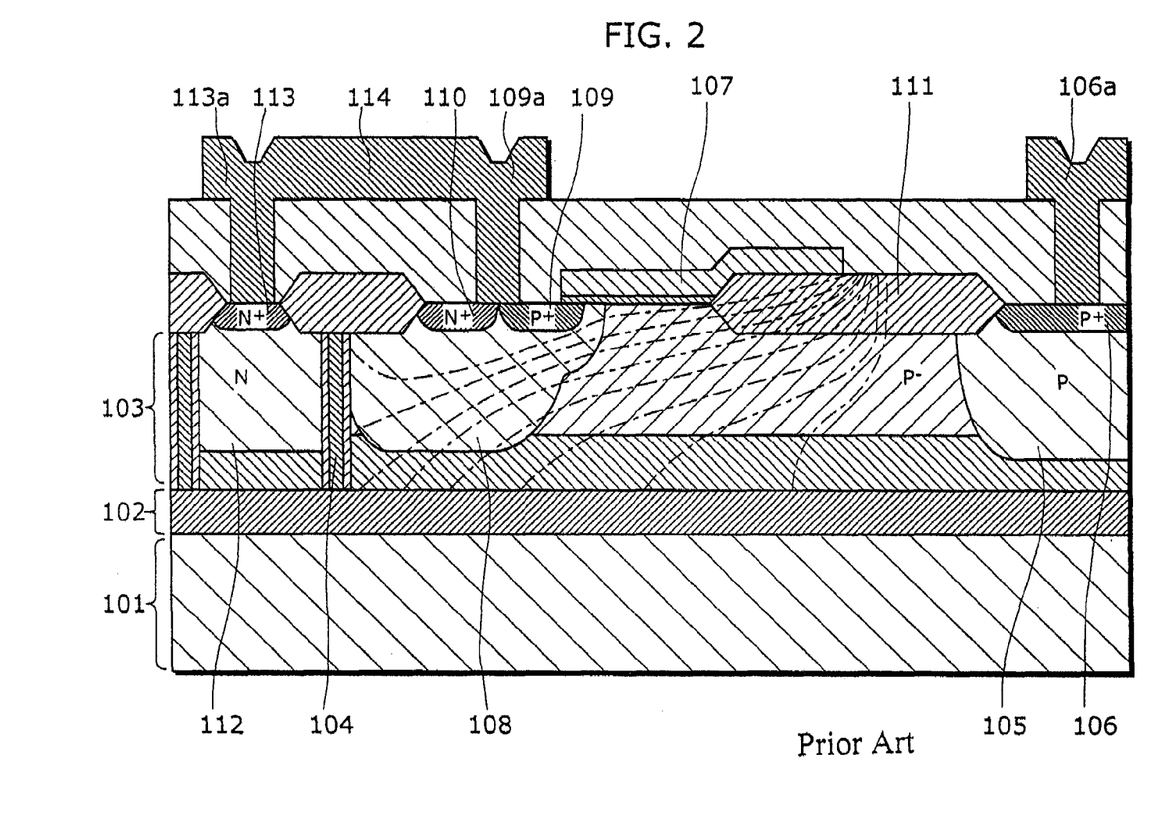
FIG. 2 is a cross-sectional diagram of a MOS transistor showing a potential distribution in the case where a ground electric potential is applied to a drain electrode and a high electric potential of positive polarity is applied to the source electrode in the MOS transistor in FIG. 1.

FIG. 2 is a drawing showing a part of a potential distribution (dotted and dashed lines) in the case where a high electric potential of positive polarity is applied to the source electrode 109a, while the electric potential of the drain electrode 106a is specified to a ground electric potential in the P-channel MOS transistor having the aforesaid structure. As shown in FIG. 2, a high electric potential of positive polarity with the same electric potential as the source electrode 109a is applied to the buffer electrode 113a through the connection unit 114, so that an electric potential difference between the buffer region 112 and the source region 109 is not generated. Thus an occurrence of an avalanche breakdown between the isolation trench 104 and the source region 109 can be prevented. As a result the breakdown voltage is determined based on the potential distribution in the drain region 105 in the conventional MOS transistor.

Figure 3:
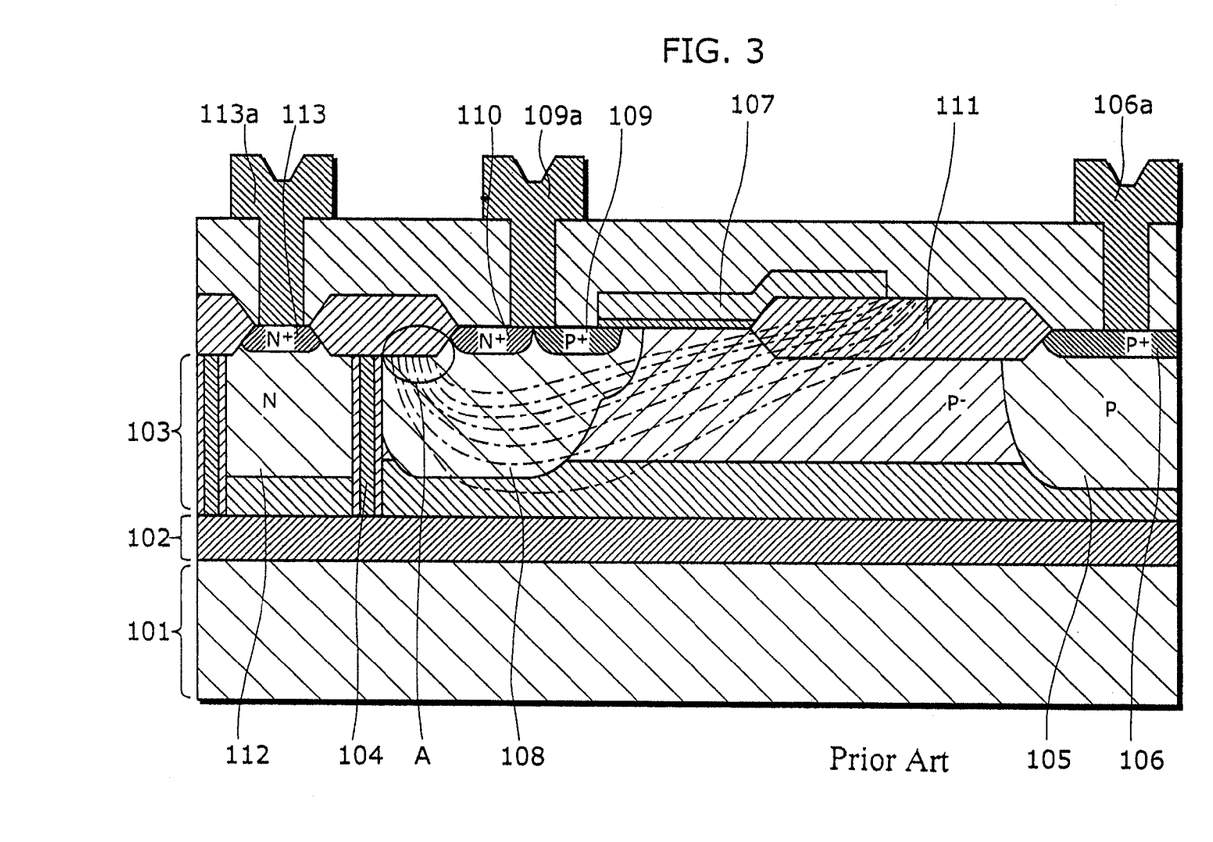
FIG. 3 is a cross-sectional diagram of a MOS transistor showing a potential distribution in the case where a ground electric potential is applied to the buffer electrode and the drain electrode, and a high electric potential of positive polarity is applied to the source electrode under a condition that a connection unit is not placed in the MOS transistor shown in FIG. 1.

FIG. 3 is a drawing showing a part of the potential distribution (dotted and dashed lines) in the case where a high electric potential of positive polarity is applied to the source electrode 109a, while the electric potentials of the buffer electrode 113a and the drain electrode 106a are specified to a ground electric potential in a P-channel MOS transistor without the connection unit 114. In Japanese Laid-Open Patent Application No. H11-330383, it is disclosed that this technology is generally used. However, the body region 108 as the N-type impurity layer is applied with an electric potential which is a higher electric potential than the electric potential of the buffer region 112, so that a depletion layer grows in the body region 108 as the N-type impurity layer. Thus, the breakdown voltage, which is supposed to be determined based on the potential distribution in the drain region 105, is actually determined based on the electric potential concentration generated by a voltage between the drain and the source in the surface region (region A in FIG. 3) between the source region 109 and the isolation trench 104. The electric potential in the surface region (region A) is concentrated and the electric field becomes exceptionally large, so that the electric potential of this case might cause a lowering of the breakdown voltage between the drain and the source in the MOS transistor.

In such a case, a conceivable method is to make the distance between the isolation trench 104 and the source region 109 longer so as to prevent an occurrence of the avalanche breakdown caused by the potential concentration in the surface region (region A in FIG. 3) between the isolation trench 104 and the source region 109. However, there exists a problem that the device area is increased by this method. Thus, it can be expected in the conventional MOS transistor shown in FIG. 1 that the occurrence of the avalanche breakdown in the surface region between the isolation trench 104 and the source region 109 can be prevented without making the distance between the isolation trench 104 and the source region 109 longer, by placing the connection unit 114 for making the potentials of the buffer region 112 and the source region 109 the same, so that the breakdown voltage between the drain and the source can be improved.

SUMMARY OF THE INVENTION

However, in the case where an N-channel MOS transistor is placed adjacent to a P-channel MOS transistor as the conventional technology, there exists a problem that the device area is increased. Hereafter, the reason of the problem is described.

Figure 4:
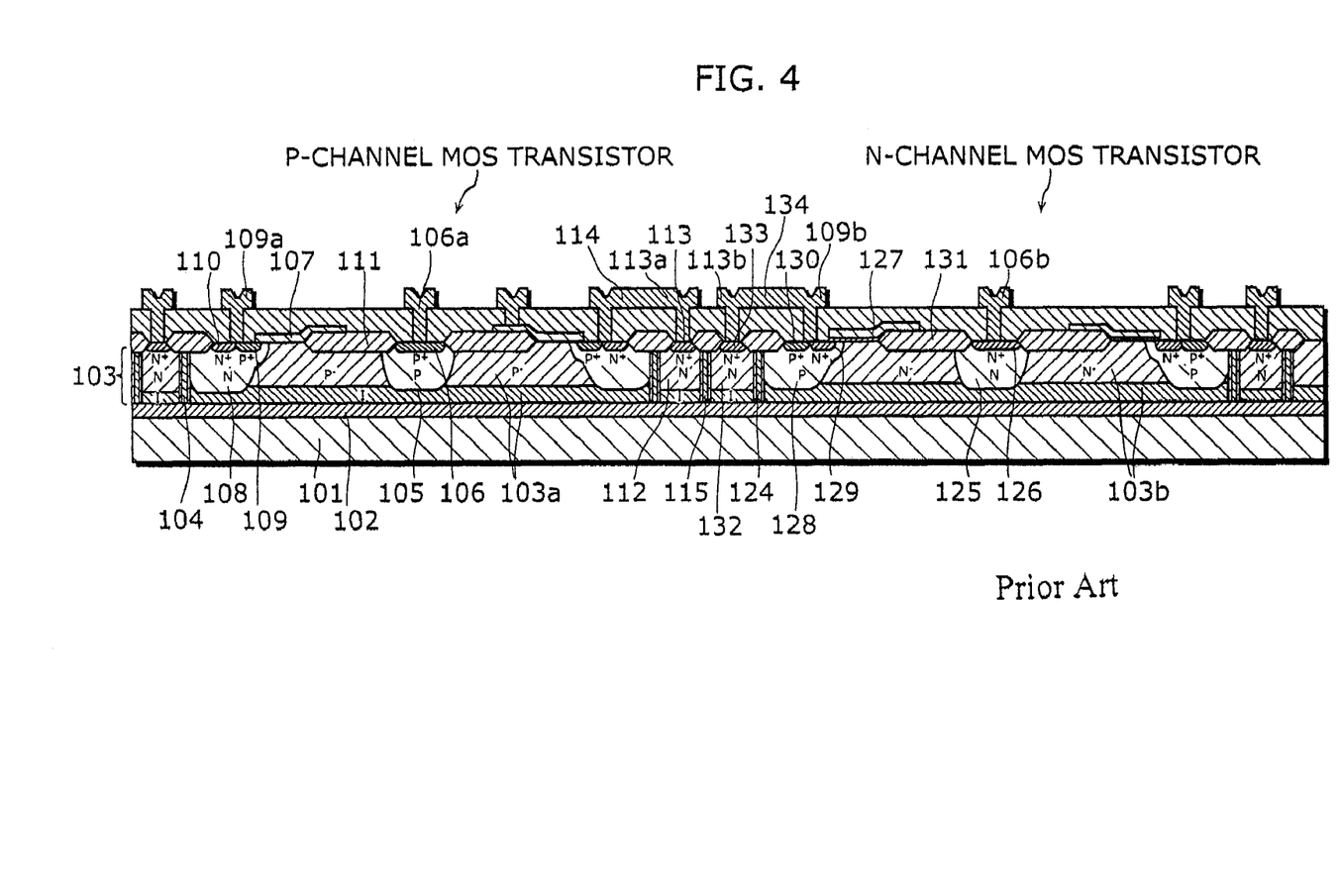
FIG. 4 is a cross sectional diagram of a semiconductor device, in which the P-channel MOS transistor shown in FIG. 2 and an N-channel MOS transistor adjacent to the P-channel MOS transistor, are formed.

FIG. 4 is a cross-sectional diagram of a semiconductor device including a P-channel MOS transistor having the structure as shown in FIG. 1 and an N-channel MOS transistor placed adjacent to the P-channel MOS transistor.

The P-channel MOS transistor structure is formed in an island-like semiconductor layer 103*a* in a semiconductor layer 103, and the N-channel MOS transistor structure is formed in an island-like semiconductor layer 103*b* in the semiconductor layer 103 which is isolated from the island-like semiconductor layer 103*a*.

A drain region 125 is formed in the center of the island-like semiconductor layer 103*b*, and a body region 128, on which a source region 129 and a body contact region 130 are formed, is placed in the outer periphery region of the drain region 125.

A drain contact region 126 is formed on the surface of the drain region 125, and a drain electrode 106*b* is placed on the drain contact region 126. A source electrode 109*b* is placed on the source region 129 and the body contact region 130. A LOCOS oxide film 131 for alleviating an electric field is formed in a predetermined part in the island-like semiconductor layer 103*b*. A gate electrode 127 is formed on the island-like semiconductor layer 103*b*.

A buffer region 132, for not to be affected by an electric interference from other adjacent elements such as the P-channel MOS transistor, is formed in the outer periphery region of the island-like semiconductor layer 103*b*, in other words in the outer periphery region adjacent to the island-like semiconductor layer 103*b* across an isolation trench 124. On the surface of the buffer region 132, a buffer contact layer 133 is formed, and a buffer electrode 113*b* is placed on a buffer contact layer 133. Here, the buffer electrode 113*b* and the source electrode 109*b* are connected through a connection unit 134.

According to the semiconductor device having the aforesaid structure, the same electric potential with the source region 109 of the P-channel MOS transistor is applied to the buffer region 112 adjacent to the P-channel MOS transistor, while the same electric potential with the source region 129 of the N-channel MOS transistor is applied to the buffer region 132 adjacent to the N-channel MOS transistor. In the generally used circuit like a CMOS circuit, a voltage of positive polarity for example power supply voltage is applied to the source region 109 of the P-channel MOS transistor, while a ground electric potential is applied to the source region of the N-channel MOS transistor for example.

Thus, the electric potential in the buffer region 112 adjacent to the P-channel MOS transistor and the electric potential in the buffer region 132 adjacent to the N-channel MOS transistor are different, so that it is not possible to share the buffer region for the both transistors. The fact results in that an isolation trench 115 needs to be newly placed between the both buffer regions; therefore the device area is increased unexpectedly.

In order to avoid the aforesaid problem, it is necessary to remove the connection unit 114 and the connection unit 134, and then to fix the electric potential in the buffer region 112 of the P-channel MOS transistor and the electric potential in the buffer region 132 of the N-channel MOS transistor to the same electric potential. For example, under a condition that the electric potential in the both buffer regions are fixed to the ground electric potential, as shown in FIG. 3, in the case where a high electric potential of positive polarity is applied to the source region 109 of the P-channel MOS transistor, the breakdown voltage is determined based on the concentration of the electric potential in the surface region between the source region and the isolation trench (region A in FIG. 3). The fact results in a lowering of the breakdown voltage of the P-channel MOS transistor. On the contrary, under a condition that the voltage is fixed to a high electric potential of positive polarity in the both buffer regions, a lowering of the breakdown voltage of the N-channel MOS transistor is caused by the same reason with the aforesaid case.

In view of the problems, the object of the present invention is to provide a semiconductor device which enables to reduce the device area, while securing the breakdown voltage between the drain and the source of each MOS transistor for the semiconductor device including plural MOS transistors, which are arrayed adjacently each other, with different types of channel conductivity.

In order to achieve the aforesaid object, the semiconductor device according to the present invention is characterized in that it includes: a semiconductor substrate; a buried oxide film formed on the semiconductor substrate; and a semiconductor layer formed on the buried oxide film. The semiconductor layer has: a first island-like semiconductor layer, in which a first MOS transistor of a first conductivity type is formed, the first MOS transistor having a) a first body region, b) a first source region that is positioned in the first body region, c) and a first drain region that is positioned in the periphery of the first body region; a second island-like semiconductor layer, in which a second MOS transistor of a second conductivity type is formed, the second MOS transistor having a) a second drain region, b) a second body region that is positioned in the periphery of the second drain region, and c) a second source region that is positioned in the second body region; a first isolation trench, positioned in the periphery of the first island-like semiconductor layer, which isolates the first island-like semiconductor layer from other portions of the semiconductor layer; a second isolation trench, positioned in the periphery of the second island-like semiconductor layer, which isolates the second island-like semiconductor layer from other portions of the semiconductor layer; and a buffer region, formed between the first isolation trench and the second isolation trench, which prevents an electrical interference occurred between the first MOS transistor and the second MOS transistor. The electric potential of the buffer region is fixed to one of the lowest electric potential or the highest electric potential in a circuit.

In the aforesaid configuration, it is preferable that the first MOS transistor is a P-channel MOS transistor and the second MOS transistor is an N-channel MOS transistor, and the electric potential of the buffer region is fixed to the lowest electric potential in the circuit.

In the aforesaid configuration, it is preferable that the first MOS transistor is the N-channel MOS transistor and the second MOS transistor is the P-channel MOS transistor, and the electric potential of the buffer region is fixed to the highest electric potential in the circuit.

In the aforesaid configuration, it is preferable that the semiconductor layer further includes a drain buffer region between the first drain region and the first isolation trench, with a lower concentration impurity than the first drain region.

In the aforesaid configuration, it is preferable that the first drain region is adjacent to the first isolation trench in the semiconductor layer.

Thus, it is possible to share the buffer region for isolating the P-channel MOS transistor from the other elements and for isolating the N-channel MOS transistor from the other elements, so that the device area can be reduced. In addition, the electric potential applied to the buffer region and the drain can be reduced, so that the distance between the isolation trench and the source region can be shorter. Further in the P-channel MOS transistor and the N-channel MOS transistor, the conductivity types of the regions adjacent to the isolation trench are the same, and either the lowest electric potential or the highest electric potential in the circuit is applied to the shared buffer region, so that the lowering of the breakdown voltage between the drain and the source in the MOS transistor can be prevented.

As described above, according to the present invention it is possible to share the buffer region for isolating the P-channel MOS transistor from other elements and for isolating the N-channel MOS transistor from the other elements, so that an additional isolation trench between the two buffer regions is not needed and the device area can be reduced. In addition, the electric potential applied to the buffer region and the drain can be reduced, so that the distance between the isolation trench and the source region can be shorter. Further in the P-channel MOS transistor and the N-channel MOS transistor, the conductivity types of the regions adjacent to the isolation trench are the same, and also the electric potential applied to the shared buffer region is fixed to the lowest potential in the circuit, so that the lowering of the breakdown voltage between the drain and the source in the MOS transistor can be prevented. In fact, there is an effect that the device area can be reduced, while the breakdown voltage between the drain and the source can be maintained.

Further Information About Technical Background to This Application

The disclosure of Japanese Patent Application No. 2005-142232 filed on May 16, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the Drawings.

DESCRIPTION OF THE PREFERRED EMBODIMENT

Hereafter, a semiconductor device of an embodiment for the present invention will be described referring to the drawings. However the present invention is not limited merely to the embodiment mentioned below.

The semiconductor device of the embodiment includes a P-channel MOS transistor and an N-channel MOS transistor adjacent to the P-channel MOS transistor.

Figure 5:
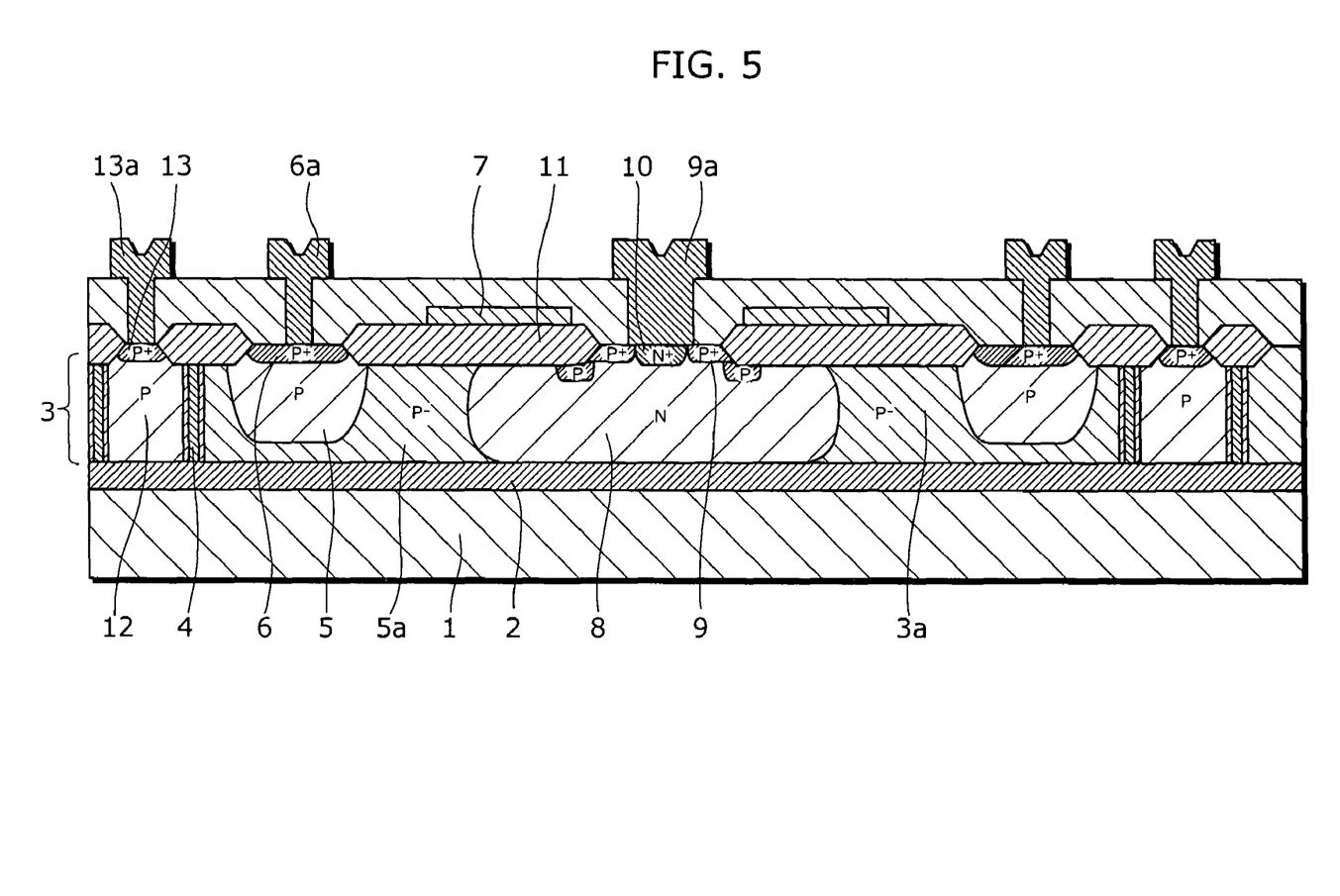
FIG. 5 is a cross sectional diagram of the P-channel MOS transistor structuring a semiconductor device according to the embodiment for the present invention.

FIG. 5 is a cross sectional diagram of the P-channel MOS transistor structuring a semiconductor device according to the embodiment for the present invention.

As shown in FIG. 5, the P-channel MOS transistor includes an SOI substrate which has a semiconductor substrate 1, a buried oxide film 2 of 1 to 3 μm in thickness placed on the semiconductor substrate 1, and a P-type semiconductor layer 3 of 3 to 5 μm in thickness placed on the buried oxide film 2. An island-like semiconductor layer 3a, in which the P-channel MOS transistor structure is formed, isolated from other portions of the semiconductor layer 3 by an isolation trench 4 in the outer periphery region of the island-like semiconductor layer 3a, is formed in the semiconductor layer 3.

A body region 8, which is an N-type impurity layer with a low concentration impurity, is formed in the center of the island-like semiconductor layer 3a. A source region 9, which is a P-type impurity layer with a high concentration impurity, and a body contact region 10, which is the N-type impurity layer with a higher concentration impurity than the body region 8 are formed in the body region 8. A source electrode 9a is placed on the source region 9 and the body contact region 10. The source region 9 and the body region 8 are electrically connected by the source electrode 9a. In addition, a gate electrode 7, which is made of polycrystalline silicon, a drain region 5 as the P-type impurity layer with a low concentration impurity and a drain buffer region 5a as the P-type impurity layer with a lower concentration impurity than the drain region 5 are formed centering on the body region 8 in the outer periphery of the body region 8. In fact, the drain region 5 and the drain buffer 5a are positioned on the opposite side of the source region 9 across the body region 8. A drain contact region 6, which is the P-type impurity layer with a higher concentration impurity than the drain region 5, is formed on the surface of the drain region 5, and furthermore a drain electrode 6a is placed on the surface of the drain contact region 6. In addition, a LOCOS oxide film 11 of 300 to 500 μm in thickness for alleviating electric field is formed on a predetermined part in the island-like semiconductor layer 3a, and the LOCOS oxide film 11 of the present embodiment operates as a gate oxide film.

A buffer region 12, which is the P-type impurity layer with a low concentration impurity, is formed in the outer periphery region of the island-like semiconductor layer 3a, that is in the outer periphery region adjacent to the island-like semiconductor layer 3a across the isolation trench 4 so as not to be affected by an electrical interference from other adjacent elements. On the surface of the buffer region 12, a buffer contact layer 13, which is the P-type impurity layer with a higher concentration impurity than the buffer region 12, is formed, and a buffer electrode 13a is placed on the buffer contact layer 13.

Accordingly, the semiconductor device of the present embodiment is characterized in that in the P-channel MOS transistor the source region 9 is formed in the center of the island-like semiconductor layer 3a, the drain region 5 and the drain buffer region 5a are formed centering on the source region 9 in the outer periphery of the source region 9, and the electric potential of the buffer electrode 13a, which is adjacent to the drain region 5 and the drain buffer region 5a across the isolation trench 4, is fixed to the lowest electric potential in the circuit.

This structure enables to prevent an occurrence of an avalanche breakdown in the surface region between the isolation trench 4 and the drain contact region 6 without increasing the distance between the isolation trench 4 and the drain contact region 6, and also enables to prevent a decrease of a breakdown voltage between the drain and the source. The reason why such preventions can be realized will be described hereafter.

According to the generally used circuit like a CMOS circuit, a high electric potential of positive polarity is applied to the source electrode 9a of the P-channel MOS transistor, and the state of the drain electrode 6a ranges from a state where a high voltage of positive polarity is applied to a state where the lowest voltage in the circuit is applied. Considering that the electric potential of the buffer electrode 13a is fixed to the lowest electric potential in the circuit, in the case where a high electric potential of positive polarity is applied to the drain electrode 6a, the electric potential difference between a) the buffer region 12 and b) the drain region 5 and the drain buffer region 5a is increased to the maximum. Therefore, the occurrence of the avalanche breakdown needs to be considered.

Figure 6:
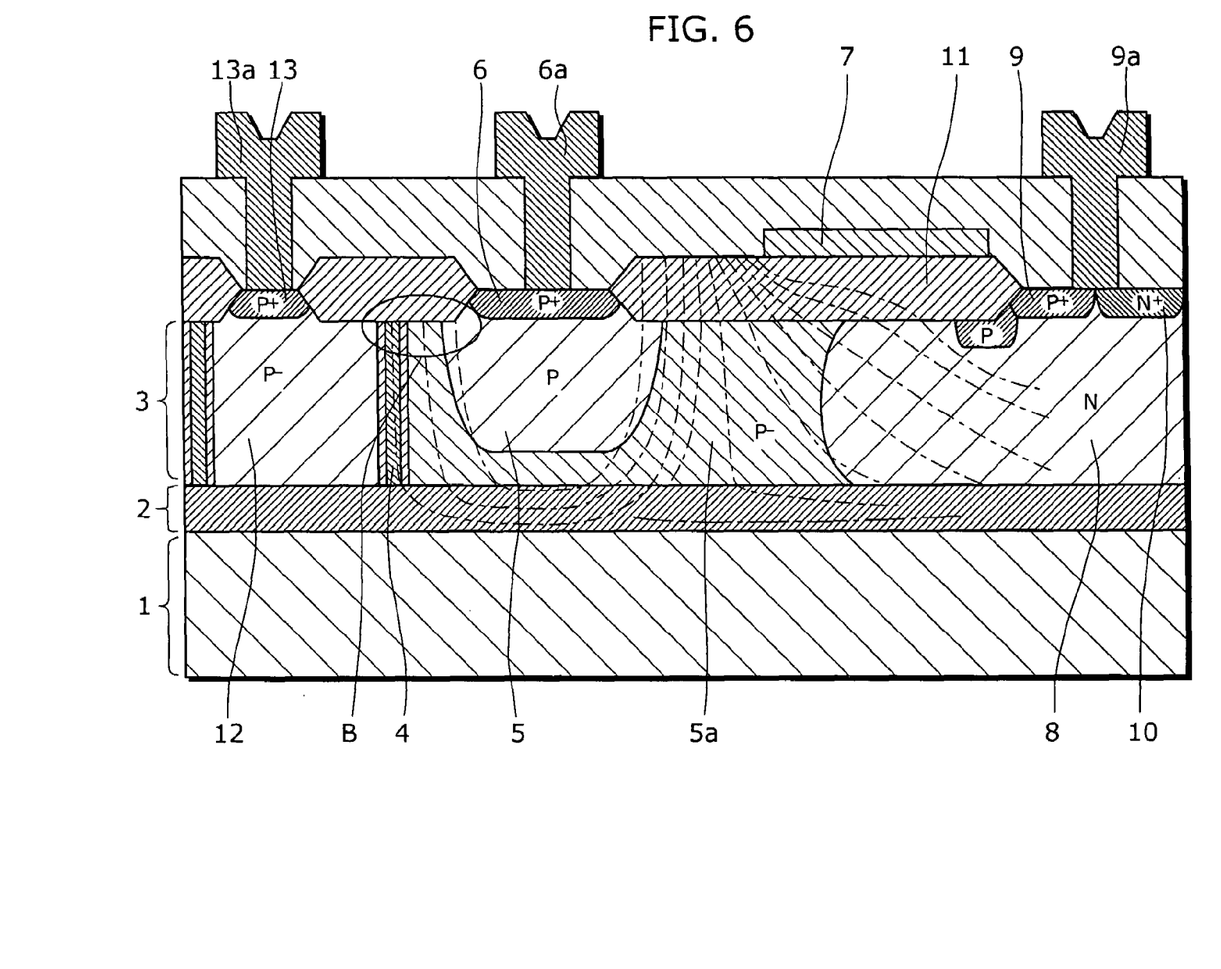
FIG. 6 is a cross sectional diagram of the MOS transistor showing the potential distribution in the case where the lowest electric potential in a circuit is applied to the buffer electrode, and a high electric potential of positive polarity is applied to the drain electrode in the P-channel MOS transistor according to the embodiment.

FIG. 6 shows a part of the potential distribution (dotted and dashed lines) under a state that the electric potential between the buffer region 12 and the drain region 5 is increased, for example under a state that the gate of the P-channel MOS transistor is on, a high electric potential of positive polarity is applied to the source electrode 9a, and an electric potential of the drain electrode 6a is fixed to an electric potential between a higher electric potential than the buffer electrode 13a and a lower electric potential than the source electrode 9a. As shown in FIG. 6, the distribution of the potential ranges between the drain region 5 and the buffer region 12 (region B in FIG. 6). The voltage added between the buffer region 12 and the drain region 5 includes a part of the voltage added between the drain region 5 and the body region 8, so that the entire voltage applied to the drain electrode 6a is not added between the drain region 5 and the buffer region 12. Thus, the voltage added between the buffer region 12 and the drain region 5 is the maximum in the case where the electric potential of the drain electrode 6a is an intermediate between the potential of the source electrode 9a and the potential of the buffer electrode 13a. The reason of the fact is that in the case where the electric potentials of the drain electrode 6a and the source electrode 9a are almost the same, there is no voltage added between the drain region 5 and the body region 8. In addition, in the case where the electric potentials of the drain electrode 6a and the buffer electrode 13a are almost the same, there is no voltage added between the drain region 5 and the buffer region 12. Therefore, the distance between the drain region 5 and the isolation trench 4 may be fixed to a value so as not to cause the avalanche breakdown in the aforesaid intermediate electric potential, so that the aforesaid distance can be shortened, and further the increase of the chip size can be restrained since a buffer region connected to the drain electrode 6a with the same electric potential is not necessary to be newly formed.

It should be noted that the drain region 5 is formed in the drain buffer region 5a, and the drain buffer region 5a is formed between the drain region 5 and the isolation trench 4 in FIG. 6. Alternatively, the drain region 5 may be formed adjacent to the isolation trench 4. In this case, the aforesaid distance can be shorter, so that it is possible to further restrain the increase of the chip size.

In the case where the lowest electric potential in the circuit is applied to the drain electrode 6a, there does not exist a problem, because the electric potential difference between the drain region 5 and the drain buffer region 5a, and the buffer region 12 is not generated.

In fact, the potential distribution is affected by neither the high electric potential of positive polarity nor the lowest electric potential in the circuit applied to the drain electrode 6a in the P-channel MOS transistor having the aforesaid structure. Thus, the occurrence of the avalanche breakdown in the surface region between the isolation trench 4 and the drain contact region 6 can be prevented without increasing the distance between the isolation trench 4 and the drain contact region 6, so that the decrease of the breakdown voltage between the drain and the source can be prevented.

Figure 7:
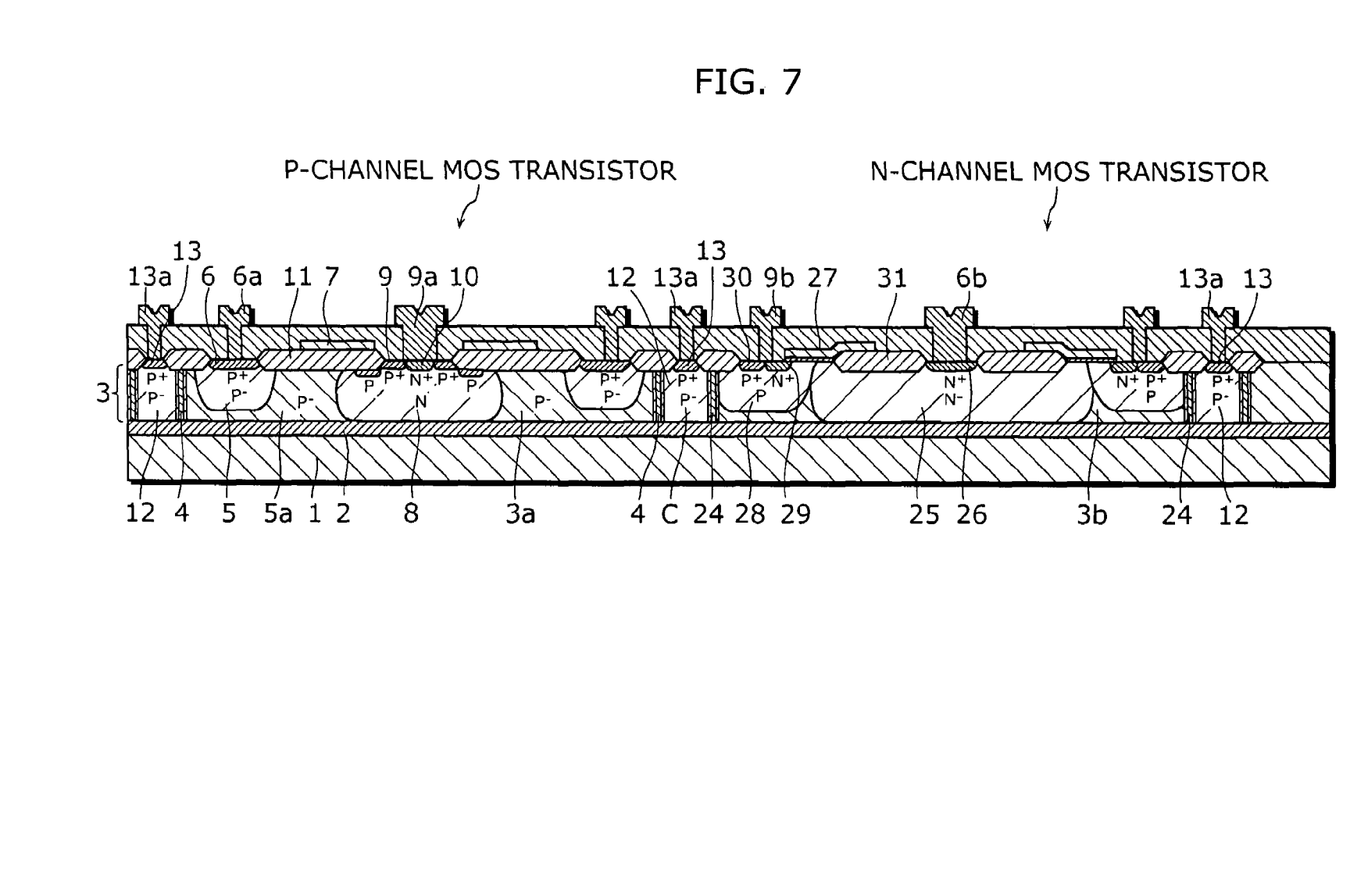
FIG. 7 is a cross sectional diagram of the semiconductor device according to the embodiment.
Figure 8:
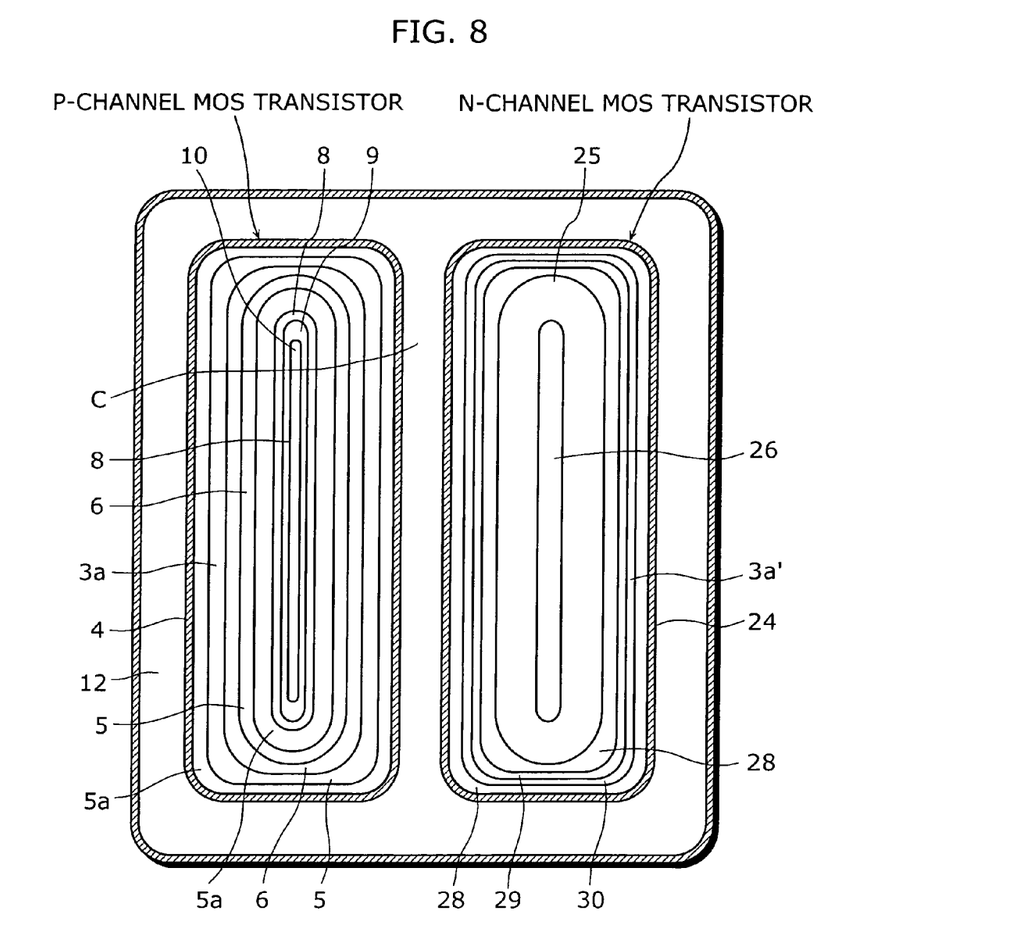
FIG. 8 is a schematic top view of the semiconductor device of the embodiment.

Next, a semiconductor device structure, in which the aforesaid P-channel MOS transistor and the N-channel MOS transistor adjacent to the P-channel MOS transistor are formed, will be described hereafter. FIG. 7 is a cross sectional diagram of the semiconductor device and FIG. 8 is a schematic top view of the semiconductor device to describe the layout plan. Note that the shaded areas in the drawing indicate the isolation trenches 4.

The P-channel MOS transistor structure is formed in the island-like semiconductor layer 3a in the semiconductor layer 3, while the N-channel MOS transistor structure is formed in the island-like semiconductor layer 3b which is isolated from other portions of the semiconductor layer 3 by the isolation trench 24.

A drain region 25 which is the N-type impurity layer with a low concentration impurity is formed, and also a drain contact region 26 which is the N-type impurity layer with a higher concentration impurity than the drain region 25 is formed in the center of the island-like semiconductor 3b. A drain electrode 6b is placed on the drain contact region 26. In addition, a body region 28 which is the P-type impurity layer with a low concentration impurity is formed centering on the drain region 25 in the periphery of the drain region 25. A source region 29 which is the N-type impurity layer with a high concentration impurity, and a body contact region 30 which is the P-type impurity layer with a higher concentration impurity than the body region 28 is formed in the body region 28. In fact, the source region 29 is positioned facing the drain region 25 across the body region 28 in the periphery of the drain region 25. A source electrode 9b is placed on the source region 29 and the body contact region 30. The source region 29 and the body region 28 are electrically connected by the source electrode 9b. A LOCOS oxide film 31 for alleviating electric field is formed in a predetermined part in the island-like semiconductor layer 3b, and a gate electrode 27 is placed on the island-like semiconductor layer 3b.

A buffer region 12, which is the P-type impurity layer with a low concentration impurity, is formed in the outer periphery region of the island-like semiconductor layer 3b, in other words in the outer periphery region adjacent to the island-like semiconductor layer 3b across the isolation trench 24 in the periphery of the island-like semiconductor layer 3b, so as not to be affected by an electrical interference from other adjacent elements such as the P-channel MOS transistor. In fact, the buffer region 12 is formed between the isolation trench 4 of the P-channel MOS transistor and the isolation trench 24 of the N-channel MOS transistor (region C in FIG. 7). On the surface of the buffer region 12, the buffer contact layer 13, which is the P-type impurity layer with a higher concentration impurity than the buffer region 12, is formed, and the buffer electrode 13a is placed on the buffer contact layer 13.

The electric potential of the buffer electrode 13a of the N-channel MOS transistor is fixed to the lowest electric potential in the circuit like the buffer electrode 13a of the P-channel MOS transistor.

According to the generally used circuit like the CMOS circuit, a high electric potential of positive polarity is applied to the drain electrode 6b of the N-channel MOS transistor, and the electric potential of the source electrode 9b is fixed to an intermediate electric potential of positive polarity in the circuit or the lowest electric potential in the circuit. Considering that the electric potential of the buffer electrode 13a, which is adjacent to the island-like semiconductor layer 3b across the isolation trench 24, is fixed to the lowest electric potential in the circuit, in the case where an intermediate electric potential of positive polarity is applied to the source electrode 9b, the electric potential difference between the buffer region 12 and the source region 29 is increased to the maximum, so that the occurrence of the avalanche breakdown between the isolation trench 24 and the source region 29 needs to be considered.

However, according to the semiconductor device having the aforesaid structure, the body region 28 as the P-type impurity layer is applied with an electric potential which is a higher electric potential than the electric potential of the buffer region 12, so that a depletion layer on the surface of the isolation trench 24 grows and extends over to the buffer region 12 side, not to the body region 28 side. Thus, the voltage added between the source region 29 and the buffer region 12 is added to the depletion layer extended to the buffer region 12 side and the isolation trench 24, so that the electric potential is concentrated to the surface region of the buffer region 12. As a result, the potential distribution at the body region 28 side of the N-channel MOS transistor is not affected by the voltage.

On the other hand, in the case where the lowest electric potential in the circuit is applied to the source electrode 9b, the electric potential difference between the drain region 25 and the buffer region 12 is not generated.

Accordingly, the potential distribution of the N-channel MOS transistor is affected by neither an intermediate electric potential of positive polarity nor the lowest electric potential in the circuit applied to the source electrode 9b in the N-channel MOS transistor having the aforesaid structure. Thus, the occurrence of the avalanche breakdown in the surface region between the isolation trench 24 and the source region 29 can be prevented without increasing the distance between the isolation trench 24 and the source region 29, so that the decrease of the breakdown voltage between the drain and the source can be prevented.

It should be noted that the electric potential of the semiconductor substrate 1 is assumed to be fixed to the lowest electric potential in the circuit in the present embodiment. In fact, it is not limited to the exemplified electric potential of the present embodiment, and the electric potential is not necessary to be the lowest electric potential in the circuit. The electric potential which does not decrease the breakdown voltage between the drain and the source can be used actually.

As described hereinbefore, according to the semiconductor device of the present embodiment, in the semiconductor device in which the N-channel MOS transistor adjacent to the P-channel MOS transistor are formed, the conductivity types are fixed to the P type for the regions adjacent to the isolation trench of the P-channel MOS transistor and to the isolation trench of the N-channel MOS transistor, and also the electric potentials for the buffer electrodes of the N-channel MOS transistor and the P-channel MOS transistor are both fixed to the lowest electric potential in the circuit, so that the decrease of the both breakdown voltages between the drain and the source can be prevented. Additionally, the buffer regions of the N-channel MOS transistor and the P-channel MOS transistor can be shared, so that an additional isolation trench between the two buffer regions is not needed, and also the device area can be reduced. Thus, the semiconductor device, which enables to reduce the device area while securing the breakdown voltage between the drain and the source, can be implemented.

It should be noted that according to the present embodiment, the drain region is formed in the outer periphery of the source region in the P-channel MOS transistor, and the source region is formed in the outer periphery of the drain region in the N-channel MOS transistor, and also the body region is formed between the source region and the isolation trench, and the electric potentials of the buffer regions of the both MOS transistors are fixed to the lowest electric potential in the circuit. However it is evident that in the case where the source region is formed in the outer periphery of the drain region of the P-channel MOS transistor, the drain region is formed in the outer periphery of the source region of the N-channel MOS transistor region, the body region is formed between the drain region and the isolation trench, and the electric potentials of the buffer regions of the both MOS transistors are fixed to the highest electric potential, the same effect can be expected.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention is applicable to a semiconductor device, and particularly to a semiconductor device and the like which are used for a driving circuit with a high breakdown voltage.

What is claimed is:

1. A semiconductor device comprising:
a semiconductor substrate;
a buried oxide film formed on said semiconductor substrate; and
a semiconductor layer formed on said buried oxide film,
wherein said semiconductor layer includes:
a first island-like semiconductor layer, in which a first MOS transistor of a first conductivity type is formed, the first MOS transistor having a) a first body region, b) a first source region that is positioned in said first body region, c) and a first drain region that is positioned in the periphery of said first body region;
a second island-like semiconductor layer, in which a second MOS transistor of a second conductivity type is formed, the second MOS transistor having a) a second drain region, b) a second body region that is positioned in the periphery of said second drain region, and c) a second source region that is positioned in said second body region;
a first isolation trench, positioned in the periphery of said first island-like semiconductor layer, which isolates said first island-like semiconductor layer from other portions of said semiconductor layer;
a second isolation trench, positioned in the periphery of said second island-like semiconductor layer, which isolates said second island-like semiconductor layer from other portions of said semiconductor layer; and
a buffer region, formed between said first isolation trench and said second isolation trench, which prevents an electrical interference occurred between the first MOS transistor and the second MOS transistor,
wherein an electric potential of said buffer region is fixed to one of a lowest electric potential or a highest electric potential in a circuit.

2. The semiconductor device according to claim 1,
wherein the first MOS transistor is a P-channel MOS transistor and the second MOS transistor is an N-channel MOS transistor, and
wherein the electric potential of said buffer region is fixed to the lowest electric potential in the circuit.

3. The semiconductor device according to claim 1,
wherein the first MOS transistor is the N-channel MOS transistor and the second MOS transistor is the P-channel MOS transistor, and
wherein the electric potential of said buffer region is fixed to the highest electric potential in the circuit.

4. The semiconductor device according to claim 1,
wherein said semiconductor layer further includes a drain buffer region between said first drain region and said first isolation trench, said drain buffer region with a lower concentration impurity than said first drain region.

5. The semiconductor device according to claim 1,
wherein said first drain region is adjacent to said first isolation trench in said semiconductor layer.

* * * * *